(12) United States Patent
Kwan et al.

(10) Patent No.: US 7,603,010 B2
(45) Date of Patent: Oct. 13, 2009

(54) DEVICE CONSISTING OF AT LEAST ONE OPTICAL ELEMENT

(75) Inventors: Yim-Bun Patrick Kwan, Aalen (DE); Michael Mühlbeyer, Aalen (DE); Johannes Lippert, Buch Am Wald (DE)

(73) Assignee: Carl Zeiss SMT AG, Oberkochen (DE)

( * ) Notice: Subject to any disclaimer, the term of this patent is extended or adjusted under 35 U.S.C. 154(b) by 0 days.

(21) Appl. No.: 11/509,154

(22) Filed: Aug. 24, 2006

(65) Prior Publication Data

US 2007/0047876 A1 Mar. 1, 2007

Related U.S. Application Data

(63) Continuation-in-part of application No. PCT/EP2005/001985, filed on Feb. 25, 2005.

(60) Provisional application No. 60/548,124, filed on Feb. 25, 2004.

(51) Int. Cl.
    G02B 6/26 (2006.01)

(52) U.S. Cl. ...... 385/52; 359/822; 250/231.14

(58) Field of Classification Search ......... 385/52; 359/822; 250/231.13, 231.14, 231.17, 231.18; 356/616–617
    See application file for complete search history.

(56) References Cited

U.S. PATENT DOCUMENTS

| 5,488,514 | A | 1/1996 | Bruning | |
|---|---|---|---|---|
| 5,822,133 | A | 10/1998 | Mizuno et al. | |
| 6,020,964 | A * | 2/2000 | Loopstra et al. | 356/500 |
| 6,549,270 | B1 | 4/2003 | Ota | |
| 2001/0038500 | A1 | 11/2001 | Shibazaki | 359/823 |
| 2003/0010902 | A1 | 1/2003 | Hof et al. | 250/216 |
| 2003/0090639 | A1 | 5/2003 | Vogt | |
| 2006/0215173 | A1* | 9/2006 | Hill et al. | 356/500 |
| 2007/0188727 | A1* | 8/2007 | Shimizu et al. | 355/55 |

FOREIGN PATENT DOCUMENTS

| EP | 1 107 068 A | 6/2001 |
|---|---|---|
| EP | 1 124 161 A2 | 8/2001 |
| EP | 1 139 175 A | 10/2001 |
| EP | 1 182 509 A2 | 2/2002 |
| EP | 1 278 089 A2 | 1/2003 |
| EP | 275 995 A2 | 1/2003 |
| EP | 1 312 965 | 5/2003 |

\* cited by examiner

*Primary Examiner*—Ellen Kim
(74) *Attorney, Agent, or Firm*—Ohlandt, Greeley, Ruggiero & Perle, L.L.P.

(57) ABSTRACT

An optical assembly comprises at least one optical element movable in at least two degrees of freedom and at least one actuator for adjusting the least one optical element; at least one sensor for sensing the position of the at least one element in at least two degrees of freedom and is characterized in that the at least one sensor is located at least substantially diagonally opposite to the least one actuator.

22 Claims, 9 Drawing Sheets

DEVICE CONSISTING OF AT LEAST ONE OPTICAL ELEMENT

CROSS REFERENCE TO RELATED APPLICATIONS

This application is a continuation-in-part under 35 U.S.C. 120 of International Application No. PCT/EP2005/001985 filed Feb. 25, 2005, which claims the benefit under 35 U.S.C. 119(e)(1) of U.S. Provisional Application Ser. No. 60/548,124, filed on Feb. 25, 2004.

BACKGROUND OF THE INVENTION

1. Field of the Invention

The invention pertains to an optical assembly comprising: at least one optical element movable in at least two degrees of freedom and at least one actuator for adjusting the least one optical element; at least one sensor, especially an encoder or another incremental measuring system, for sensing the position of the at least one element in at least two degrees of freedom, and equivalents of such.

2. Description of Related Art

For reflective optical assemblies such as the projection optics used for EUV (extreme ultra-violet) lithography high optical specifications demand that the optical elements are stable to each other to sub-nanometer levels. This requirement is coupled with the necessity of handling an amount of heat absorbed in the optical elements, making a passive system of actuators to manipulate the optical assembly extremely difficult to implement. For example, the relative positions of two mirrors 1 m apart on an Invar™ structure would already change 1 nm at 1 mK temperature change. This is in addition to any long-term dimensional changes during the lifetime of the assembly (typically ten years), such as stress relaxation in the materials, and in particular at joints employed in the design. Also all varieties of oscillatory motions add on.

Such long term effects can, of course, be compensated if one or more optical elements can be adjusted in situ. The actuation of multiple optical elements in multiple degrees of freedom during service has long been applied in refractive optics. Furthermore, with the ability to measure optical wavefront qualities emerging from optics not only manufacturing errors can be compensated to a large extent, but more important long term thermal effects in service.

A number of measurement systems already exist which can offer measurement accuracy and resolution to sub-nanometer level. The most common of these are laser interferometers and capacitor sensors. A laser interferometer is essentially an incremental relative measurement system capable of registering changes in positions from an initial state, and offers high measurement bandwidth. A capacitor is an absolute sensor which has a very limited range, requires close proximity of the sensing surfaces, and has limited bandwidth.

For an active optical positioning system, i. e., a system which permits changes of its position, and which is applicable in EUV or other precision optics, a combination of both of the above is required. This is because the high active positioning assembly demands a very high servo bandwidth which is beyond the capability of most capacitive sensing systems. While the interferometer can fulfill such requirements, it requires the optical elements to be in such an initially ideal state that the image quality of the assembly is already good enough during start-up, or at least in the capture range of any image quality sensing means with which the optics can eventually be brought into the ideal positions. This implies that some means of holding positions of optical elements to nanometer level has to be provided for during power off, which in turn greatly limits the choice of actuation concepts.

From EP 1 182 509 A2 a lithographic projection apparatus is known which comprises a displacement measuring system.

U.S. Pat. No. 6,549,270 B1 relates to an exposure apparatus in which information such as the position, inclination, or shape of a plurality of mirrors constituting a projection optical system is measured with a mirror monitor mechanism.

EP 1 124 161 A2 pertains to a lithographic projection apparatus having a temperature controlled heat shield. Also EP 1 278 089 A2 describes a lithographic apparatus in which the projection system comprises a plurality of optical elements or sensors mounted on a frame.

According to US 2003/10902 A an optical system with a plurality of optical elements is provided which comprises a load receiving portion which takes over the forces exerted by the optical elements.

From U.S. Pat. No. 5,488,514 a mounting seat for an optical element is known which is decoupled from a surrounding annulus that fixes the mount in place in an optical system.

EP 1 312 965 pertains to an optical element holding apparatus.

In US 2001/00358500 A1 inter alia a holding device for an optical element is shown. All cited references are incorporated by reference. Their description here is not complete and does not constitute any admittance of prior art.

BRIEF SUMMARY OF THE INVENTION

An object of the present invention is to provide an optical assembly which allows for high precision measurements of its positions.

According to an aspect of the invention this object is solved by an assembly wherein the at least one sensor is located at least substantially diagonally opposite to the least one actuator.

"Diagonal" is understood in a very broad sense. It is defined based on thermomechanical and oscillation-mechanical (dynamic) stability of the optical element (mirror) and its mount assembly, with respect to its optically used part (illuminated reflecting surface).

A connecting line between an actuator and a sensor located diagonally will pass through a projection of the optical element's optically used part onto a plane comprising the points of this actuator and sensor pair. Preferably this line will pass approximately through a centre of this projection.

For optical assemblies of a generally rotationally symmetrical form, the lexical definition of the diagonal passing through the axis of symmetry is comprised, with variations of up to ±30 degrees (angle between line actuator-sensor and line actuator-axis).

For substantially polygonal assemblies this term "diagonal" shall also include all edge-to-edge lines having a length of more than 60% of the maximum strength of such, and the lines in between.

When the sensor or the measuring device is at a position which is as far as possible away from the position of an actuator exerting forces to the object to be measured in at least one of the degrees of freedom the change of position at the sensor or the measuring device is the largest possible if the assembly is tilted or pivoted. Even if the assembly is shifted, an advantage of the distance between the measuring device and the actuator is that mutual influence of sensor or measuring device and actuator is reduced.

Advantageous embodiments and designs of the invention are contained the description and in the drawings, with combinations not limited to expressly stated ones.

In an embodiment according to the invention adapted for sensing a position of at least one element a position of the sensor deviates not more than 30 degrees from the diagonal with the one actuator. This permits sufficient precision in measuring the positions of the element.

In another embodiment, there may be provided one actuator and two sensors each for sensing between one and five degrees of freedom, respectively, of the assembly and each having preferred distances of about 120 degrees from each other with respect to the optical or gravitational centre wherein each of the devices does not deviate more than ten degrees from the preferred distances. In this embodiment, preferably, a cylindrical coordinate system is applied with its cylinder axis being an approximate axis of rotational symmetry of that arrangement.

A further advantageous design of the invention is an optical assembly which comprises one actuator and two sensors each sensing between one and five degrees of freedom, respectively, of the assembly wherein the sensors are positioned substantially on a centre orthogonal to the connecting line of said two sensors.

In another embodiment of the invention the optical assembly comprises one actuator and two sensors each sensing between one and five degrees of freedom, respectively, of the assembly or of the at least on optical element the actuator wherein the actuator is positioned substantially in the centre of gravity of the assembly or of that optical element of which the position is changed by the actuator.

According to another advantageous design of the invention the optical assembly comprises one actuator and three sensors each sensing between one and four degrees of freedom, respectively, of the assembly wherein the sensors and the actuator are positioned at substantially equal distances from one another at four corners of the substantially circular outer margin of the assembly.

The present invention is also related to an optical assembly wherein the actuator is positioned at a single support of the assembly or of the optical element of which the position is changed. A single point-support provides for most simplicity and minimal deflection of the assembly or mount to be supported.

When there are three actuators for adjusting the at least one optical element and at least one sensor for sensing between one and six degrees of freedom of the assembly the at least one optical element is preferably positioned diagonally opposite to one of the actuators.

Preferably, three actuators correspond to three sensors wherein the actuators are positioned at angles of substantially 120 degrees to each other with respect to the centre of the assembly.

In another preferred embodiment, the actuators each are positioned at a point of support of the optical assembly or of the at least one optical element. Such actuators thus may have the additional object of supporting the assembly or the optical element, respectively.

In an embodiment of the invention there is provided one sensor which determines the positions of the optical assembly or of the optical element in three degrees of freedom, e. g. in the X-, Y- and Rz-directions, in the horizontal plane whereas three sensors each determine a degree of freedom in the vertical plane, e. g. in the Z-, Rx- and Ry-directions. Here X, Y, Z are Cartesian coordinate axes of related translatory degrees of freedom, with a Z-axis oriented vertically. Rx, Ry, Rz are rotation axes associated to rotational degrees of freedom, oriented in the indexed Cartesian coordinate axes. Various short range displacement sensing technologies can be employed, including optical triangulation, fiber-optic back scatter, interferometric sensors (which can have a very short optical path in air and therefore be much less sensitive to environmental fluctuations), capacitive sensors. Especially, an encoder may be employed. Such sensors have a resolution on the picometer level.

A typical encoder consists of a reading head and a grating, the latter being a pure passive part and is preferably mounted on the movable object to avoid cabling onto the latter, as the cables would then generate disturbance forces onto the moving object during positioning. The attachment of the grating to the movable object is of great advantage in terms of stability, and is advantageously effected by physical bonding or wringing.

In addition to combining the high bandwidth of the interferometer and the initializing capability of the capacitive sensor, the encoder can also be built in a much more compact form which not only saves space but also moving masses which in turn enhances the dynamics of the positioning system. The only disadvantage is probably an impaired linearity compared to the interferometer in vacuum, but this can be compensated by means of error mapping techniques, making full use of the encoder's high repeatability.

Since the encoder only measures the relative movement between the reading head and the grating, the mounting of the reading heads relative to each other and to the mechanical structure of the optical assembly is of importance. Preferably, a separate sensor mounting frame is employed which is dynamically completely isolated from any reaction forces of actuation as is known from EP 1 275 995 A2, e. g. Preferably, the material of the frame is nearly insensitive to any temperature change as it is disclosed in EP 1 278 089 A2 for example.

When mounting the reading head to the frame, kinematic mounting principles have to be respected so that the position of the reading head in relation to the frame is statically determined. The sensor head can be mounted to the frame by wringing. To further improve thermal stability of the sensor frame, thermal shields can be incorporated to provide a thermally biased or stabilized environment at substantially constant temperature and substantially independent of external thermal loading and/or temperature changes of the environment as is known from EP 1 124 161 A2, e. g.

All above cited references are incorporated herein by reference.

To ensure the highest possible thermal stability, the optical elements of the reading head are made from a material having a very low ("zero") thermal expansion, such as ZERODUR® by Schott Glas, or INVAR® or ULE® by Corning, and are held together by wringing or physical or chemical bonding. Also, to remove any potential heat source from the vicinity of the reading head, all active, energy dissipating elements of the encoder (such as light sources, detectors and evaluation electronics) are placed preferably in a remote position and are linked to the reading head either optically or electrically.

The thermal stability can be significantly improved by intermittent direct measurements, e. g. once during five minutes, of the line of sight and aberration errors of the projected image at wafer level with the use of a measuring interferometer.

In another embodiment the sensor comprises an absolute position sensor, e. g. a capacitive sensor measuring the absolute position of the assembly or of the optical element and a relative position sensor, e. g. an interferometer.

According to another embodiment of the invention the at least one optical element in the optical assembly is provided with at least three encoders each for measuring at least one coordinate of the optical assembly or of the at least one optical element.

Up to six single-coordinate or three two-coordinate encoders or any other incremental measuring systems are used for each optical element to be positioned in up to six degrees of freedom. It reveals as advantageous when the encoders are spaced substantially equally around a perimeter basis of the at least one optical element, e. g. substantially 120 degrees apart from each other with respect to the centre of the optical element.

In this embodiment the measurement axes used by the at least three encoders, i. e. the directions in which the measurements are carried out, at least substantially point to an optical centre of the assembly or the at least one optical element. This means that the measurement axes ideally point to a single point, the measurement point, which substantially coincides with the optical centre of the reflective surface.

When the optical element is a mirror the optical centre is preferably positioned at a reflective surface. But the optical element may also be a transmissive element such as a lens, a group of elements, such as a group of lenses being connected by wringing, a prism, a grating or an interferometer.

In this way, uniform thermal expansion of the optical element induces equal errors on all measurement axes which thus cancel themselves. If two-coordinate encoders are used, the measurement points of the two axes substantially coincide. Any residue offset between the two measurement points is to be kept at a minimum and is pre-calibrated and compensated for in a sensor metrology model.

In order that any local deformation of the optical element due to any actuation forces have minimum influence on the position measurements, the actuators are advantageously mounted as remote as possible from the encoders. In case of a 120 degrees arrangement the actuators are placed at 60 degrees between the encoders.

According to another design of the invention an optical element with at least one actuator is provided wherein the actuator influences the optical element and has a plurality of degrees of freedom wherein the actuator is capable of generating movements or forces or moments in at least two directions and at least one sensor, especially a position encoder with at least two degrees of freedom is provided, wherein the at least one sensor is located at least substantially diagonally opposite to the least one actuator.

According to another embodiment a group of actuators is provided which exerts a linear or 1-axis rotational displacement or a force or a momentum at effective points of action upon the optical element.

Furthermore, the optical element is equipped with actuators which have effective points of action upon the optical elements which are substantially coinciding. The actuators may be assembled as a hexapod actuator group.

Preferably, the actuator group is a two-beam actuator group of two actuators with a common point of action at the optical element.

In a preferred embodiment the optical element or optical assembly comprises a sensor with a plurality of degrees of freedom.

The invention also refers to an optical element or an optical assembly wherein at least one sensor comprises a measuring device and a gauge scale.

Furthermore, an optical element may comprise a gauge scale which consists of or comprises a two-dimensional grid, especially of crossing lines, or a checker board system of areas for measurements of position.

In another embodiment of the invention an optical element has an approximately rotational symmetric shape and. Such symmetry is characterized a high degree of symmetric mechanical properties, especially of oscillations of the element, its stiffness and its moments of inertia.

According to another design of the invention an optical element comprises at least one spherical or at least one aspherical lens, or at least one mirror.

An optical element according to the invention may have a plane of maximum area wherein the plane is substantially circular.

In another embodiment the optical element has a shape which includes extensions, especially mounting pads, or cutouts.

A preferred optical assembly comprises at least one optical element which is movable in at least two degrees of freedom and at least one actuator for adjusting the least one optical element; at least three sensors, wherein the at least one actuator is positioned in an effective point of action of the element, especially at or in the proximity of its centre of gravity or at an or in the proximity of an intersecting point of normals in the measuring plane of the sensors.

Another preferred optical assembly comprises at least one optical element and at least one actuator attached to the at least one optical element, wherein the actuator has a plurality of degrees of freedom of movement of the optical element, wherein at least one position sensor is attached to said optical element or is attached to a frame of a holding device, especially of a barrel, wherein the at least one position sensor has a plurality of dimensions of measurement of a position of the at least one optical element.

Especially, the optical assembly is assembled in a way that the at least one optical element has a maximum width and at least one of said actuators and at least one of said position sensors is distant from each other by at least one third of said maximum width.

In another preferred embodiment of the optical assembly the optical element has an at least approximately rotationally symmetric shape which has an outer radius and an axis of rotational symmetry and an angle, defined by an attachment position of one of the actuators on the optical element, the axis of symmetry and the attachment position of one of said position sensors, is in a range between 90° and 270°.

The invention pertains to an optical assembly wherein the actuator is fixed at the optical element. Compared with optical elements of the state of the art where the actuators have to be positioned in the socket or support of the assembly which causes additional positioning work, the optical element bears the actuators at its edge, its boundary or its outer circumference. The actuators may be fixed by different means, but gluing and wringing, also in combination, are preferred.

Additionally, the optical assembly may comprise a sensor with a sensing head and a sensing gauge wherein the sensing head or the sensing gauge is fixed at the optical element, especially by gluing or wringing.

In another embodiment of the invention an optical assembly is provided which consists at least of one optical element which is actuated in more than three degrees of freedom. The assembly is characterized in that the position of said element in the actuated degrees is measured by means of at least one incremental encoder.

The at least one encoder may comprise an optical grating as its passive part.

The at least one encoder preferably measures in at least two degrees of freedom.

Preferably, each encoder is equipped with an index (home) pulse in each of the measured degrees of freedom within the working range.

In such an optical assembly the optical or measurement axes of the encoders in each degree of freedom substantially coincide at one point, a point of coincidence.

The point of coincidence preferably is substantially at or close to the thermal centre of the optical element.

In such an optical assembly an optical grating (passive part) of the at least one encoder may be directly attached to a monolithic optical element, i. e. without an intermediate holding device.

In a preferred embodiment the optical grating is attached by wringing or gluing or cold bonding to the optical element.

BRIEF DESCRIPTION OF THE SEVERAL VIEWS OF THE DRAWINGS

Embodiments of the invention will now be described, by way of example only, with reference to the accompanying drawings in which.

DETAILED DESCRIPTION OF THE INVENTION

Figure 1:
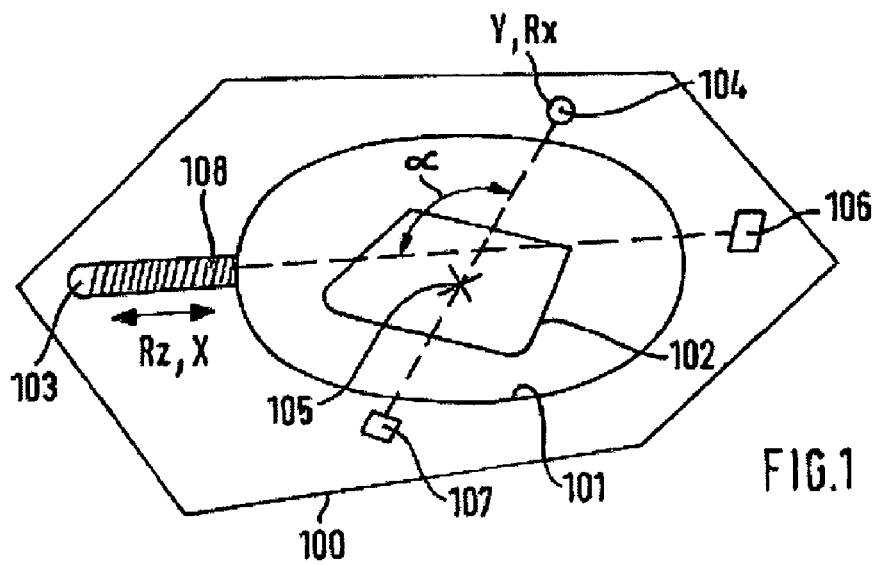
FIG. 1 a polygonal asymmetric mount with a mirror substrate positioned on it, wherein the mirror comprises an illuminated asymmetric area, FIG. 2 a rectangular symmetric mount with a rotationally symmetric illuminated area on a substrate positioned on the mount, FIG. 3 a scheme of an asymmetric optical element, FIG. 4 a cross-section of an asymmetric mirror arranged on a mount.

In an embodiment according to the invention (FIG. 1) a mount 100 supports a mirror substrate 101. The substrate 101 comprises an illuminated area 102. The position of the substrate 101 is movable by at least two actuators 103, 104 which preferably are located at an angle of substantially 90° (±10° or 15°) or less to one another with respect to an optical centre 105 of the area 102 whereas on the sides opposite to the positions of the actuators 103, 104 are positioned two sensors 106, 107. The sensors 106, 107 are arranged in that way that lines connecting actuator 103 with sensor 106, and actuator 104 with sensor 107 intersect close to the centre 105 or exactly in it.

Alternatively the lines cross in the gravitational centre of the substrate 101 which may coincide with the optical centre 105.

The actuators 103, 104 stand in a direct contact with the substrate 101, e. g., when they are positioned between the mount 100 and the substrate 101, or by means of a connecting element, e. g. a rod 108 or by gears. For instance, the actuator 103 provides for movability of the substrate 101 in the X and Rz-directions whereas the actuator 104 moves the substrate 101 in Y and Rx-directions.

The mount 100 has a form of an irregular polygon, but may have a regular or symmetric form in the alternative.

Figure 2:
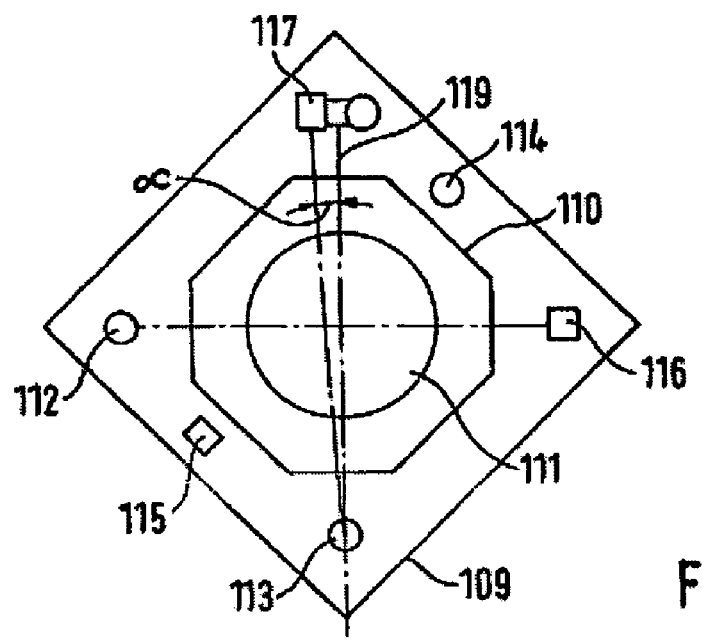

FIG. 2 shows a mount 109 in form of a regular rectangle on which is located an octagonal substrate 110. The substrate 110 comprises an illuminated area 111. Preferably, actuators 112, 113, 114 are positioned in form of a triangle on the mount 109 around the substrate 110 or at its boundaries to put it into rotational or translatory movement with respect to the mount 109; and sensors 115, 116, 117 are positioned on the opposite sides of the mount 109.

Diagonals connecting the actuators 112, 113, 114 with the sensors 115, 116, 117 on the corresponding opposite side of the substrate 110 cross in a point which coincides or nearly coincides with the optical or gravitational centre of the substrate 110. But the positions of the sensors 115, 116, 117 may deviate from diagonals symmetrically intersecting the substrate 110 as line 119 by an angle α of up to 10°.

Figure 3:
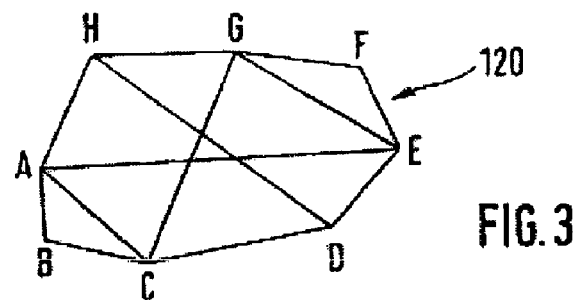

FIG. 3 schematically shows preferred positions of actuators at the outer margin or boundary of a substrate 120 that has the form of an irregular polygon with corners A, B, C, D, E, F, G, and H. Diagonals connect point A with the points C and E. Other diagonals connect the point D with the point H, and the point E with the point G. A-E is the longest diagonal of the substrate 120 and, hence, is particularly suitable for positioning an actuator at point A and a sensor at point E, and vice versa.

The length of a diagonal at the furthest points of which an actuator and a sensor may be positioned shall, according to the invention, not be less than 60% of the length of the longest diagonal of the substrate 120, i. e. the diagonal A-E. Thus, the lengths of diagonals A-C and G-E are too short for positioning an actuator and a sensor at their extreme ends.

Figure 4:
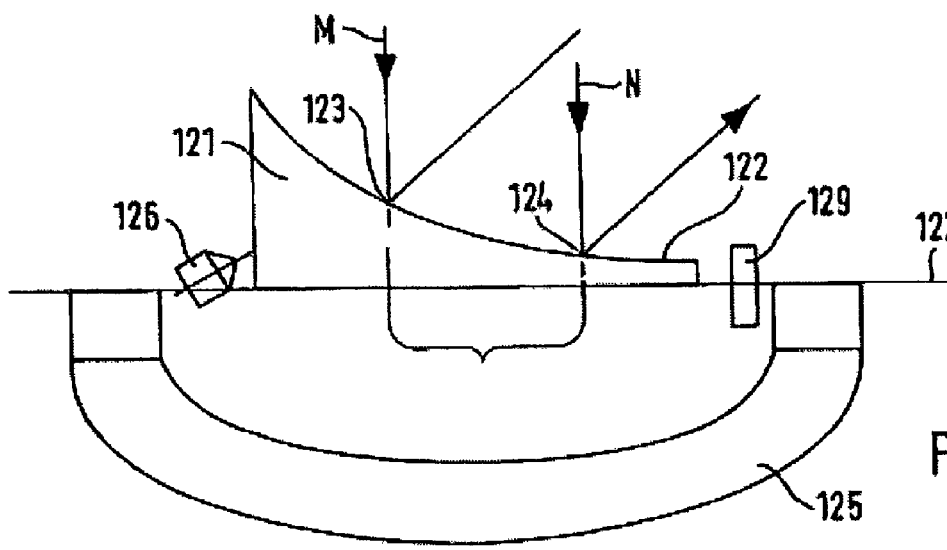

FIG. 4 shows a mirror 121 with a concave reflective area 122 reflecting beams M, N of light. Only the region between points 123, 124 at which the beams M, N are reflected is used optically. The mirror 121 is located on a mount 125. The position of the mirror 121 with respect to the mount 125 may be changed by an actuator 126 in a plane of projection 127. Any change implemented by the actuator 126 is measured by a sensor 129 positioned at the opposite side of the mirror 121.

Figure 5:
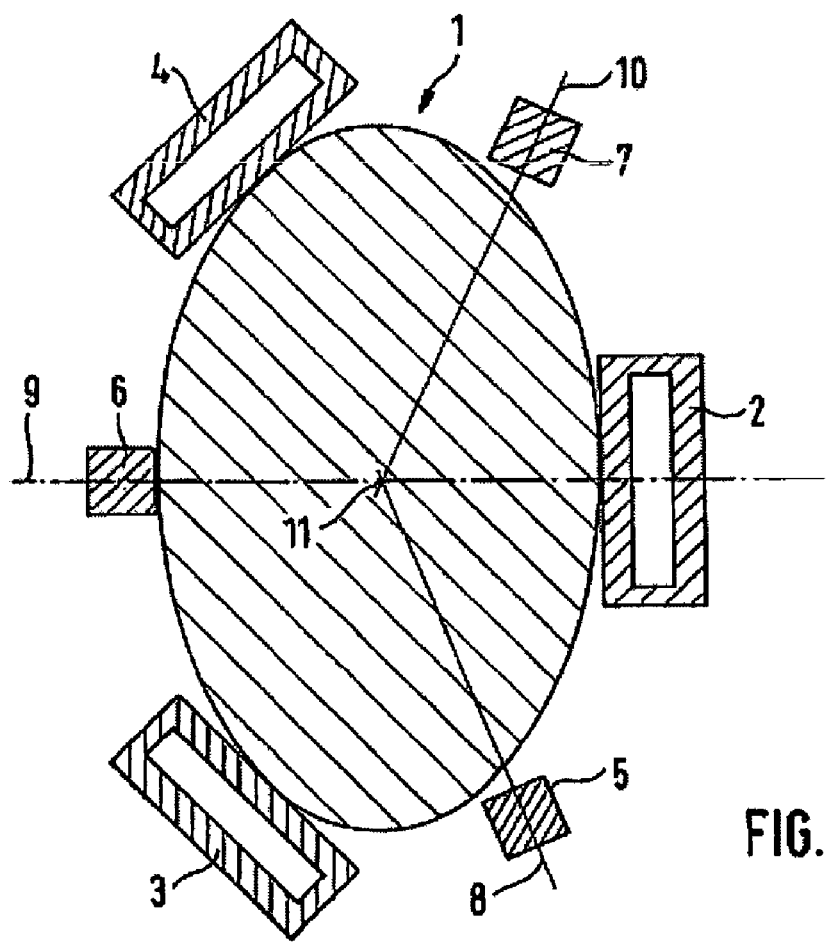
FIG. 5 is a cross-section of a lens which is movable by three actuators.

An optical assembly consists of or comprises a lens 1 (FIG. 5). The lens 1 is held and is movable by three actuators 2, 3, 4 which move the lens 1 in all 6 degrees of freedom. Preferably, each of the actuators 2, 3, 4 moves the lens in two degrees of freedom. Alternatively, a combination of actuators 2, 3, 4 is possible in which one actuator changes three degrees of freedom, a second actuator changes two degrees of freedom whereas the third actuator changes only one degree of freedom. Actuators preferably are constituted by linear path actuators as piezo stack drives or by linear force actuators (voice coils or Lorentz actuators).

Diagonally opposite to each of the actuators 2, 3, 4 are disposed three sensors 5, 6, 7 which measure any change of position of the lens 1 in all six degrees of freedom.

Preferably, symmetric lines 8, 9, 10 through the sensors 5, 6, 7 point to the optical centre 11 of the lens 1 and to the actuator 2, 3, 4 on the diagonally opposite side of each of the devices 5, 6, 7. The optical centre 11 typically corresponds to the centre of gravity of the lens.

The devices 5, 6, 7 may be encoders or interferometric measuring devices. They are substantially equally spaced around the perimeter of the lens 1, i. e., 120 degrees apart from one another with respect to the optical centre 11. Because of the symmetry of the actuators 2, 3, 4 positioned diagonally opposite to the devices 5, 6, 7 the actuators 2, 4, 6 each have a distance of 60 degrees to the neighbouring device 5, 6, 7.

The long distance between each of the actuators 2, 3, 4 and the devices 5, 6, 7 diminishes measuring errors and increases exactness of measurements.

The geometry of measuring devices and actuators shown in FIG. 5 is applicable to all lenses, mirrors and combinations of optical elements combined together by wringing or any other technique. In case that the optical device contains a mirror, an actuator can be deployed on the back side of the mirror and as close as possible to the optical centre or the centre of gravity. The only disadvantage of this construction is that any heat generated by the actuator would have direct impact to the mirror itself, thus creating extra thermal load to the mirror.

Figure 6:
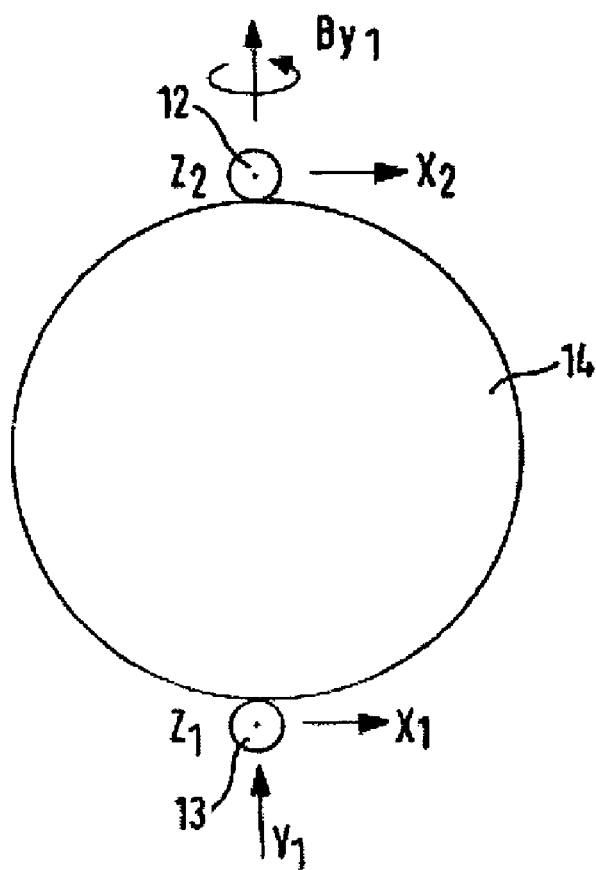
FIGS. 6, 7 depict two different arrangements with sensors.

In another embodiment (FIG. 6) two sensors 12, 13 are positioned diagonally opposite on another optical device 14. Each of the sensors 12, 13 measures up to three degrees of freedom. An actuator (not shown) is positioned on the underside. An angle of 90 degrees between each of the sensors 12, 13 and the actuator is obtained.

In case of 1 actuator and 2 sensors applied to an optical device according to the invention, these could be positioned at angles of 120 degrees with respect to the optical or gravitational centre apart from one another to provide the greatest possible distance between them.

Figure 7:
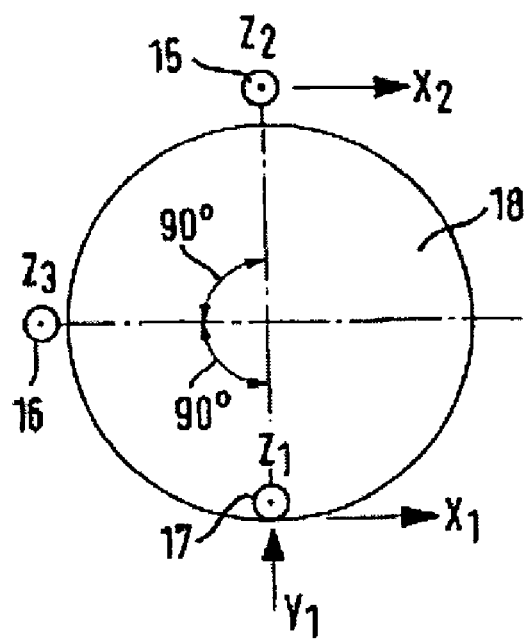

In the embodiment of FIG. 7, three sensors 15, 16, 17 are applied to an optical device 18. Each of the sensors 15, 16, 17 measures 1, 2, or 3 degrees of freedom (dimensions). An actuator (not shown) is positioned on the underside of the device 18 or diagonally opposite to the sensor 16 in the same plane in which the sensors 15, 16, 17 are positioned.

Preferably the actuator is attached to a single point support which must have stiffness in all six degrees of freedom. Compared to a single point support a three point support has the advantage to provide for better stability of the device. When the object to be supported is weak in one torsional axis even a four-point support may be realized. A special embodiment derived from an arrangement incorporating two actuators contains one actuator adjustable in three degrees of freedom and three actuators each adjustable in one degree of freedom only. Such an arrangement is known in (wafer or reticle) stage technology in which one actuator positions the wafer (or reticle) chuck in the horizontal plane (X, Y, Rz) and three vertical actuators (Z1, Z2, Z3) determine Z as well as Rx and Ry. Preferably, the three Z-actuators are placed relatively wide apart in order to generate sufficient moment for pitch and roll corrections.

Figure 8:
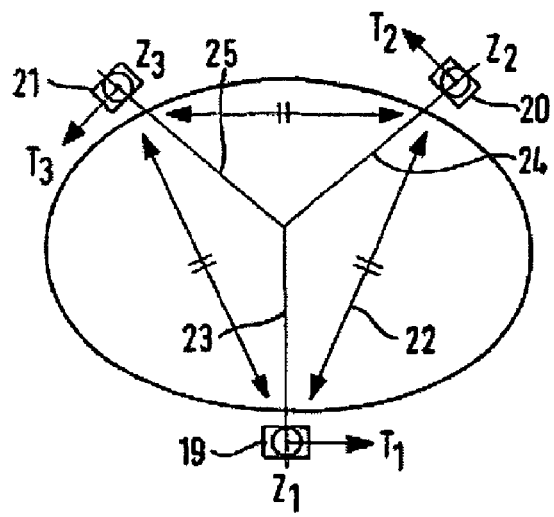
FIGS. 8-19 show optical elements in or at which actuators are implemented.

In a preferred embodiment actuators allow for movements in all six degrees of freedom, i. e. three translational degrees of freedom (e. g. Cartesian X-, Y- and Z-axes) and three rotational degrees of freedom (pitch (Rx), roll (Ry) and yaw (Rz)-movements). Therefore three actuators 19, 20, 21 (FIG. 8) are provided at the outer margin of an optical element. Each of the actuators can be individually moved in the Z-direction and can be tilted thereby permitting movements in all directions of the six degrees of freedom whereby each of the actuators 19, 20, 21 carries out one rotational and one transitional movement. The actuators 19, 20, 21 are preferably positioned at equal distances. They form angles of 120° with respect to the optical or gravitational centre and are positioned at the corners of an at least substantially equilateral triangle 22. The normals 23, 24, 25 of the triangle 22 coincide in one point which preferably is the optical centre of element and which, additionally may be situated in the vertical axis of the centre of gravity of the element. So each two normals 23, 24, 25 also have an angle of 120 with respect to said axis.

Figure 9:
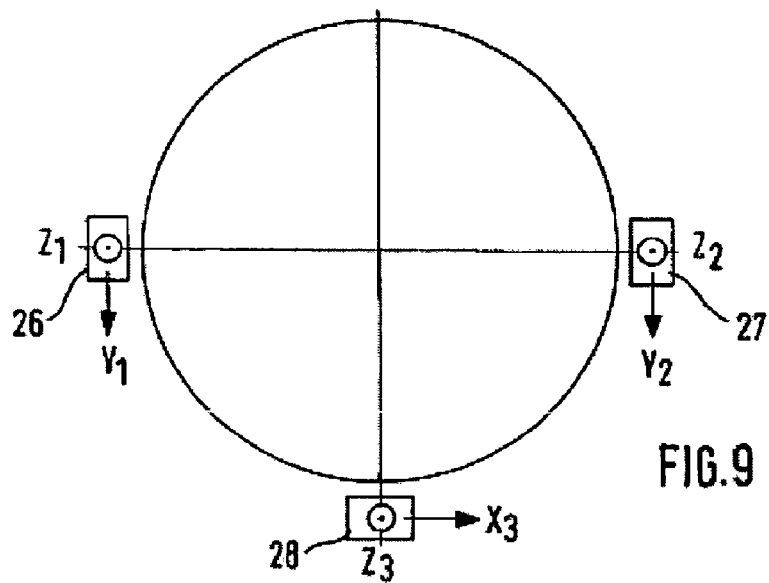

In another embodiment each of three actuators 26, 27, 28 (FIG. 9) carries out a movement in the Z-direction. The actuators 26, 27 are positioned opposite to each other whereas actuator 28 is positioned under an angle of substantially 90° with respect to actuators 26, 27. Additionally, actuators 26, 27 carry out movements of the optical element in the Y-direction. Actuator 28 permits movement in the X-direction.

Figure 10:
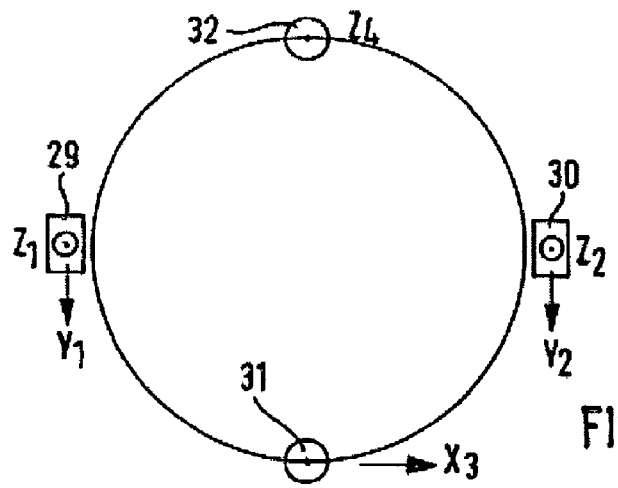

In another embodiment four actuators 29, 30, 31, 32 (FIG. 10) are designated to permit movements in all degrees of freedom. The actuators 29, 30 are positioned on opposite sides of the optical element and move it both in Z- and Y-direction whereas actuators 31, 32 move in the X-directions, respectively, the actuators 31, 23 having only one degree of freedom.

Figure 11:
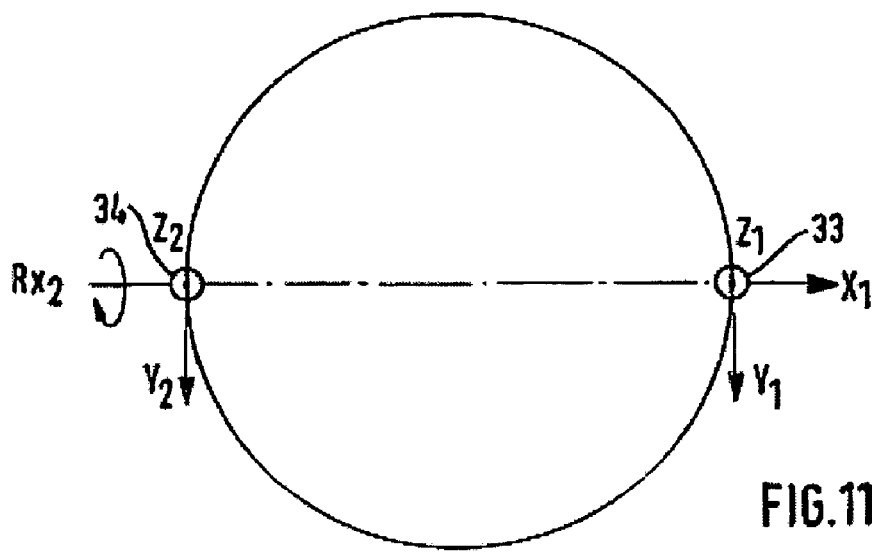

In a further embodiment two actuators 33, 34 (FIG. 11) are provided which are positioned opposite to each other. Actuator 33 is movable in X-, Y- and Z-direction whereas actuator 34 is movable in Rx-, Y- and Z-direction whereby permitting a movement of the optical element in all six degrees of freedom.

Figure 12:
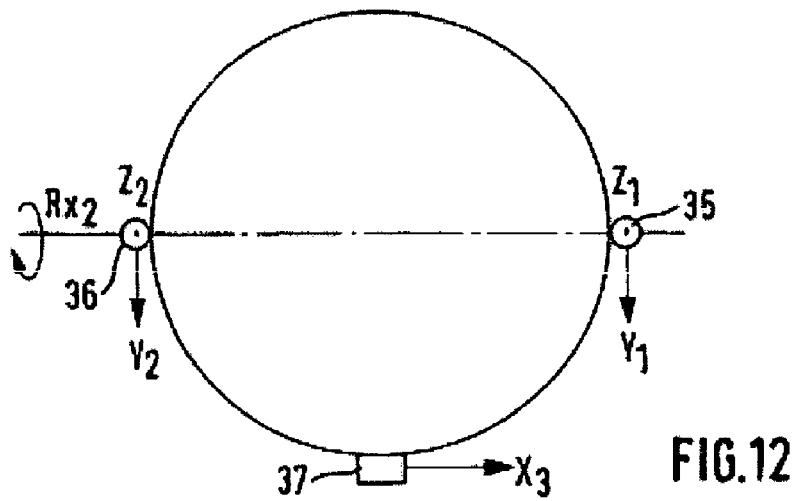

Actuators 35, 36, 37 (FIG. 12) permit another optical element to be moved in six degrees of freedom wherein actuator 35 moves in the Z- and Y-direction. Actuator 36 moves in the Rx-, Y- and Z-directions. Actuator 37 moves only in the X-direction.

Figure 13:
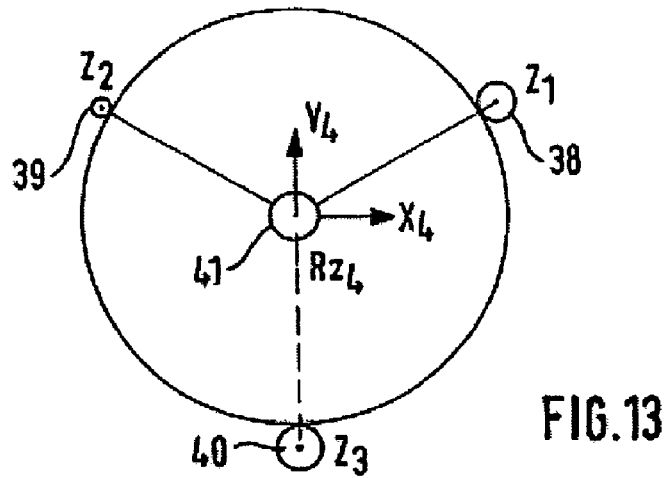

In another embodiment four actuators 38, 39, 40 and 41 (FIG. 13) are provided. Actuators 38, 39, 40 are preferably at the same positions as are actuators 19, 20, 21 of FIG. 8. Each of actuators 38, 39, 40 is capable of causing a movement in the Z-direction. The additional actuator 41 is situated on the underside of the optical element which preferably is a mirror. Actuator 41 is movable in the X-, Y- and Rz-directions.

Figure 14:
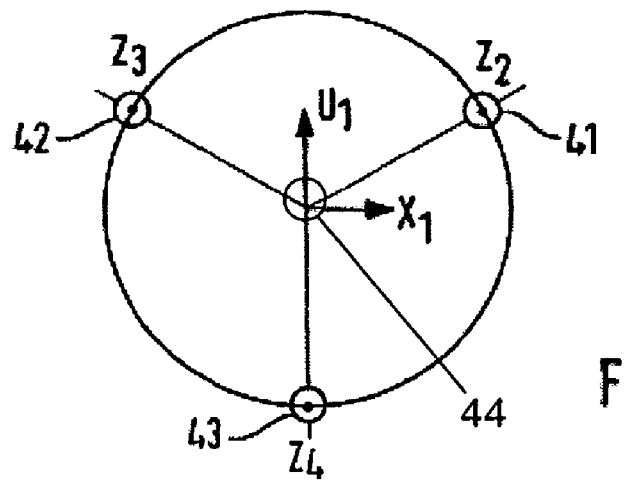

FIG. 14 shows an embodiment of the invention where three actuators 41, 42 and 43 each are movable in Z-direction whereas another actuator 44 is positioned in the centre, preferably at the underside of a mirror, and allows for movability in the X- and Y-directions. Thus, this embodiment has five degrees of freedom, totally. The yaw direction is not provided.

Figure 15:
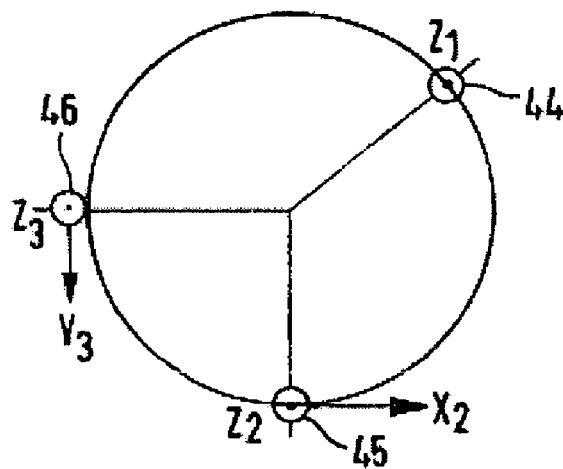

Five degrees of freedom are permitted in an embodiment (FIG. 15) where actuators 44, 45, 46 each are movable in the Z-direction. Additionally, actuator 45 is movable in the X-direction whereas actuator 46 is movable in the Y-direction.

Figure 16:
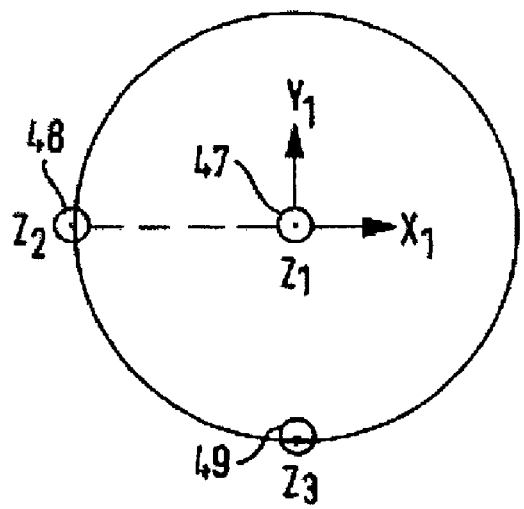

In another embodiment where actuator 47 (FIG. 16) is positioned in the centre and actuators 48, 49 at the edge, movements in the X-, Y- and Z-direction are provided by actuator 47. Actuators 48, 49 each are movable in the Z-direction.

Figure 17:
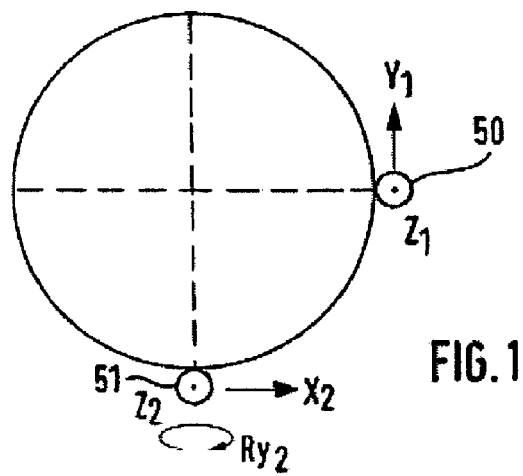

In another design of the invention (FIG. 17) two actuators 50 and 51 are provided wherein actuator 50 permits movements in Y- and Z-directions. Actuator 51 allows for movements in the X-, Z- and Ry-directions.

Figure 18:
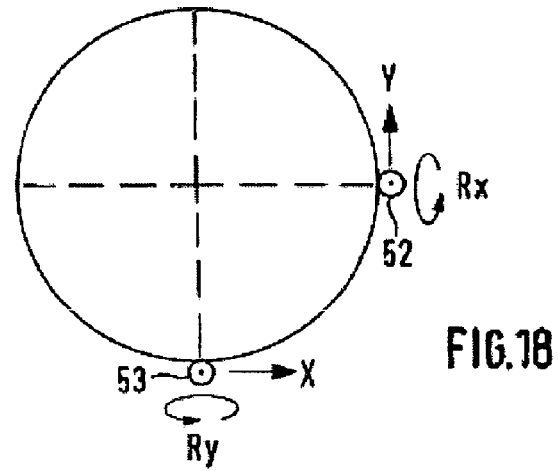
Figure 19:
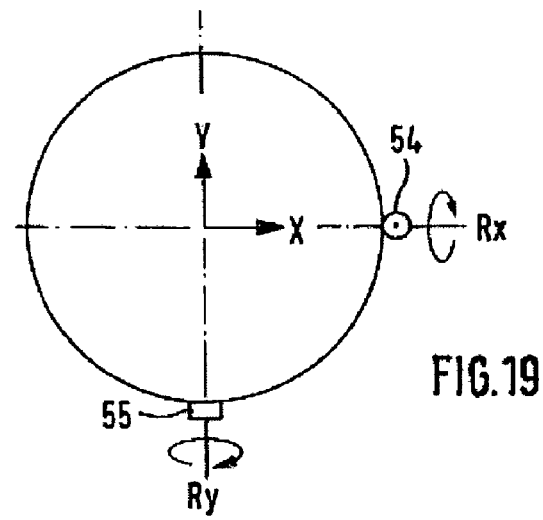

Only four degrees of freedom are permitted in an embodiment (FIG. 18) where two actuators 52, 53 are positioned at the boundary of the optical element. Actuator 52 moves in Y- and Rx-directions; actuator 53 moves in X- and Ry-directions. In a similar way four degrees of freedom are provided when actuators 54, 55 (FIG. 19) move in the X-, Rx-directions and Y-, Ry-directions, respectively.

Figure 20:
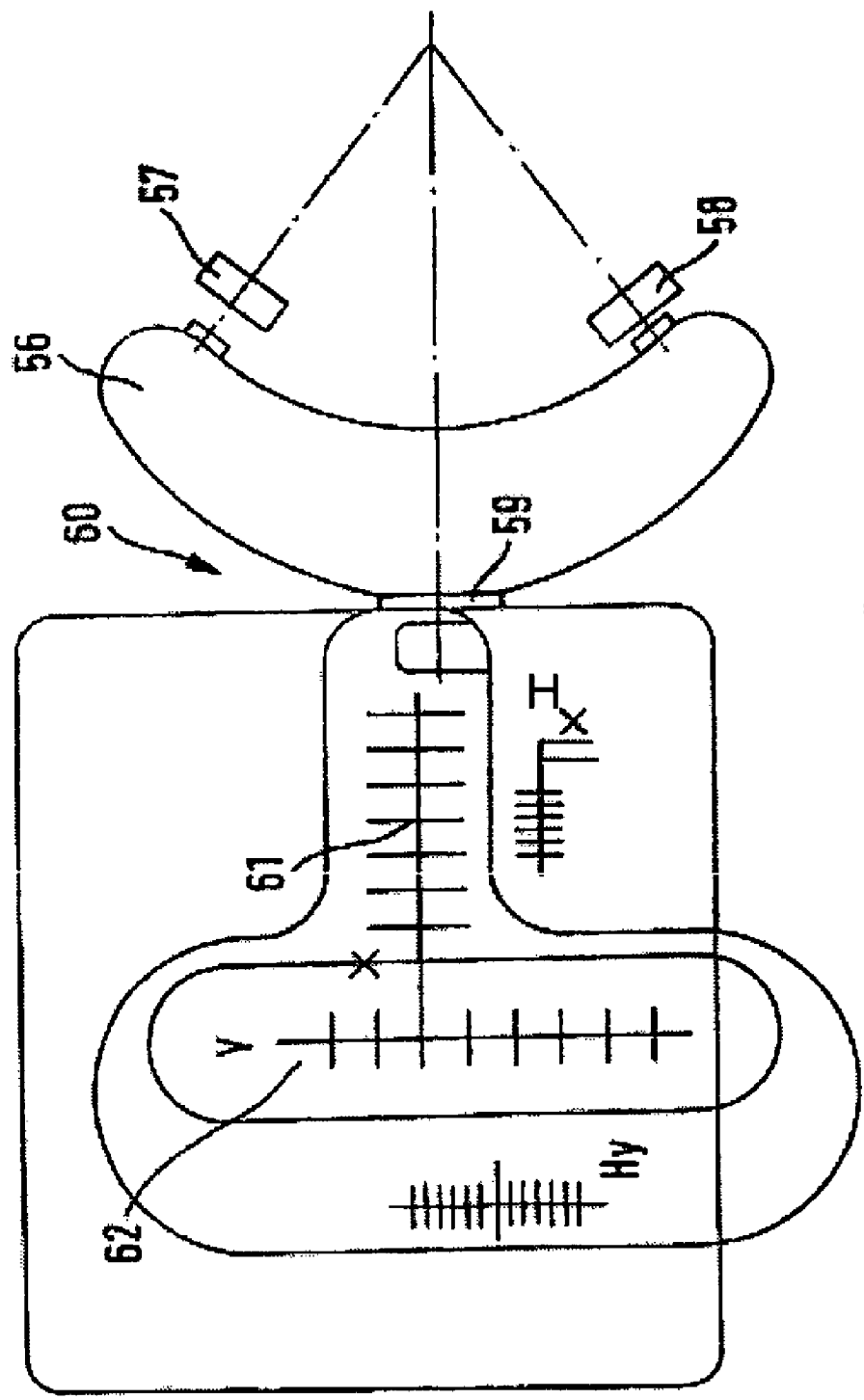
FIG. 20 shows a longitudinal section through an optical element with two actuators and an encoder.

In each of the optical devices according to the invention actuators may be fixed at the boundary of the optical element as shown in FIG. 20 at an element 56 which bears two actuators 57, 58 which are held by gluing or wringing. On the underside of element 56 is fixed a sensing head 59 of an encoder 60 which comprises a grid or scales 61, 62 for determining the position of the element 56 in the X- and the Y-directions, respectively. (For the sake of better comprehensibility scale 61 is depicted in a large magnification.) The grid or the scales 61, 62 are fixed at a fix support or a fix socket of the optical assembly or element which is movable with respect to the support or the socket. Each of the scales 61, 62 may include a reference mark.

In the alternative the sensing head is borne by the socket or the support, or the sensing head is attached to the socket whereas the scales or the grid are fixed at the boundary or margin of the optical element or the assembly.

Figure 21:
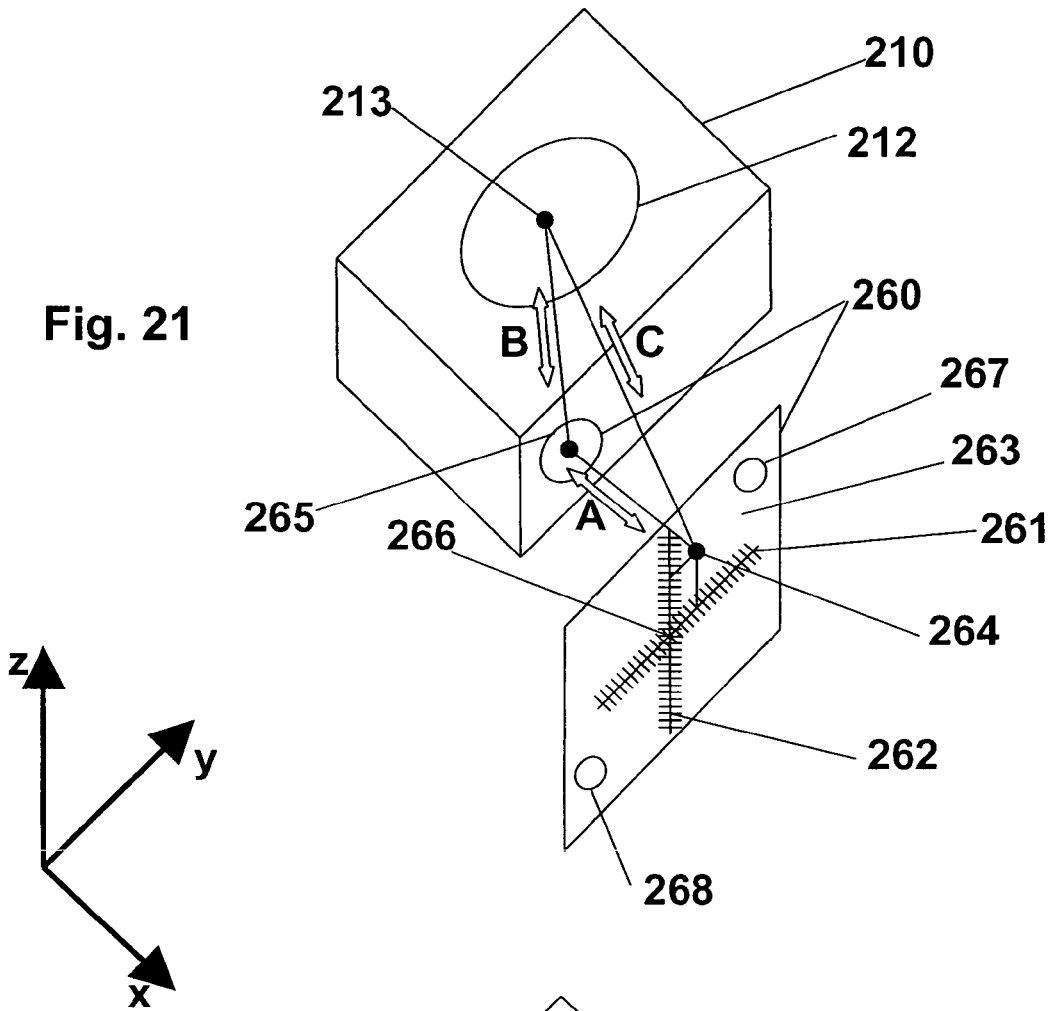
FIG. 21 is a schematic arrangement of an encoder module at an optical element.

FIG. 21 schematically shows an alternative embodiment of the invention.

An optical element 210 which can be part of an optical assembly or which is for example part of a lithography projection exposure apparatus comprises an illuminated area 212. The illuminated area 212 is illuminated for example with light from an EUV source of an EUV lithography projection exposure apparatus or any other light source of a lithography projection exposure apparatus. The optical element 210 can be a mirror, a lens, a diffractive or refractive optical element, a polarization changing optical element or just an optical filter. Additionally the optical element 210 comprises an optical centre 213 (more general a "point of interest") which is part of the illuminated area 212 and usually is the centre of this illuminated area, or which is defined in a way as described in connection with FIG. 1. The optical centre usually forms a "point of interest", meaning that the position of the optical centre has to be known and has to be adjusted in space as precise as possible. Especially in EUV-lithography the optical centre of some mirrors of the EUV lithography projection exposure apparatus has to be controlled on a sub-nanometer level regarding their position and orientation in up to six degrees of freedom. However, the optical centre or "point of interest" can be an optical centre in the sense that it is on an optical axis, or the "point of interest" can be a thermal centre of the optical element. Further, as mentioned the optical element 210 can be controlled regarding its spatial position in at least two degrees of freedom. The movement of the optical element 210 in space is done by actuators or at least one actuator (not shown) as described above in connection with the other embodiments of the invention.

For the determination of the position of the optical element 210 regarding the controlled degrees of freedom an encoder module 260 is used. The encoder module comprises a grid-like structure or a system of scales 261 and 262 forming a structured surface 263 and a sensor head 265. The sensor head 265 has a measuring direction as designated by arrow A in FIG. 21.

The grid-like structure or the scales 261, 262 are arranged such that a position 264 on the structured surface 263 of the encoder module 260 can be unambiguously identified by coordinate values. These coordinate values of a position 264 are read out by the sensor head 265 if the measuring direction of the sensor head intersects the structured surface 263 at the position 264. Further, these coordinate values define the relative position of the structured surface 263 and the sensor head 265 in a vector subspace defined by the structured surface 263. In FIG. 21 this relative position is marked with the arrow A which also shows the measuring direction of the sensor head 265. If (in the arrangement of FIG. 21) also the position of the sensor head 265 on the optical element 210 is known relative to the optical centre 213 (marked with arrow B) then the position of the optical centre 213 relative to the structured surface 263 of the encoder module can be determined (marked with arrow C).

In one embodiment the sensor head 265 is fixed to the optical element 210 or a holding structure (not shown) of the optical element as shown in FIG. 21. The structured surface 263 of the encoder module 260 is fixed on a structure (not shown) which is kept in a fixed position relative to the optical element 210, this fixed structure is also called reference structure.

However, the arrangement of the encoder module 260 can be such that the structured surface 263 is fixed on the optical element 210 or a holding structure (not shown) of the optical element 210, or is on parts of the surface of the optical element or the holding structure, and the sensor head 265 is fixed to the reference structure (not shown) which is kept in a fixed position relative to the optical element 210. Such an embodiment is shown in FIG. 22.

The grid-like structure of the encoder module 260 can be formed by a Cartesian coordinate system made of a crossed line structure, meaning two grids are arranged under 90° to each other. Other structures like polar coordinates are also possible, or any inclined coordinate systems comprising two parallel grids inclined to each other by an angle different from 90° and different from 180°, as shown in FIG. 21 and FIG. 22.

Further, the structured surface 263 preferably but not necessarily is a plane surface. In general the surface 263 can be of arbitrary three-dimensional shape, e.g. a spherical calotte. Depending on the shape of the surface 263 the grid-like structure or the scales are adapted in such a way that with the use of the sensor head 265 the position of the sensor head 265 relative to the structured surface 263 is determinable at least in the subspace defined by the structured surface 263. Usually this relative position is determined relative to a reference position 266 on the surface 263. Usually but not necessarily the reference position 266 is the point of origin of the coordinate system on the structured surface 263.

Figure 22:
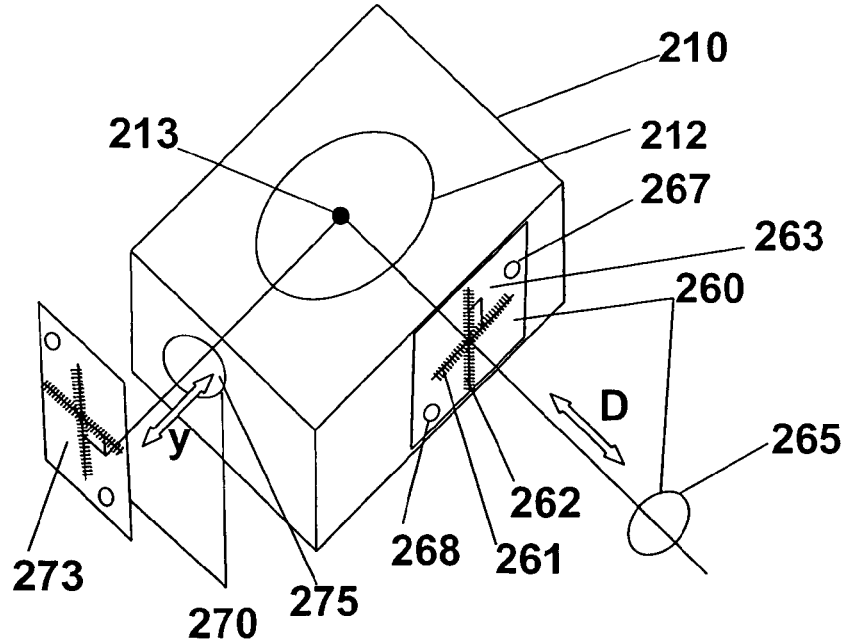
FIG. 22 shows an additional arrangement of two encoder modules at an optical element.

According to the present invention the spatial position or changes in the spatial position of the optical element 210, which in FIG. 22 is adjustable in the two degrees of freedom by at least one actuator or by actuators (not shown), is determinable by only one encoder module 260 as described above.

To be more general, with the present encoder module 260 it is possible to determine the position of an optical element 210, which is adjustable in n-degrees of freedom (n is from 2 to 6) in these n degrees of freedom, with n−1 or less sensor units. In this case the encoder module 260 is treated as one sensor unit. If only encoder modules 260 are used for position measurement of the position of the optical element 210, only three encoder modules 260 are sufficient to determine the position of the optical element 210 in 6-degrees of freedom. With the values of the sensor units the actuators are controlled which are positioning the optical element 210 in the respective degrees of freedom.

Further, the encoder module 260 may comprise reference marks or reference scales 267, 268 similar as the encoder shown in FIG. 20. Preferably for each coordinate value of the structured surface 263 of the encoder module 260 at least one reference mark or reference scale is provided. It is preferred that the structured surface comprises reference marks or reference scales in at least one degree of freedom. With the use of the reference marks or scales it is possible to determine a starting point for the measurement or a home position to adjust the sensor head 265 and the structured surface 263 relative to each other.

A further aspect of the present invention is the specific arrangement of the encoder module 260 relative to the optical element 210 as will be described together with FIG. 22 which schematically shows the optical element 210 as described in FIG. 21, whereas the same elements are denoted by the same reference numerals. However, in FIG. 22 the structured surface 263 of the encoder module 260 is arranged on the optical element 210 or its holding structure (not shown), or is arranged on parts of the surface of the optical element or of the holding structure as already described above as an alternative embodiment. The sensor head 265 in this case is fixed to the structure (or reference structure—not shown) which is kept in a fixed position and to which the position of the optical element 210 is determined.

Further, in the embodiment of FIG. 22 the encoder module 260 is arranged such that there is very reduced or preferably almost no sensitivity of the encoder module data if the absolute distance between the structured surface 263 and the sensor head 265 changes in the measuring direction of the sensor head 265. Such a change of distance is designated by arrow D. The direction D as mentioned is the direction of the measurement direction of the sensor head 265. Just for the case that this measurement direction is perpendicular to the structured surface 263 and this surface is a plane surface of the encoder module 260, the direction D is a direction perpendicular to the structured surface 263.

In a more general expression, the structured surface 263 and the sensor head 265 of the encoder module 260 are arranged such that any expected change of the absolute distance between these elements in the measuring direction of the sensor head 265 which is caused by any relative movement of the optical element 210 (or its support or holding structure) has negligible influence on the encoder module date. This is the case, if the optical element 210 is supported in a way that the relative movement of the optical element 210 is in a direction which is parallel to the measuring direction of the sensor head 265. In the embodiment shown in FIG. 22 the measuring direction (arrow D) of the sensor head 265 is perpendicular or almost perpendicular to the structured surface 263 of the encoder module 260. The relative movement of the optical element 210 can be caused by controlled actuation with an actuator. Applying the just mentioned rule to the arrangement of the actuators results in that at least one actuator is arranged such that the adjustment of the optical element by the at least one actuator is in a direction parallel to the measuring direction of the sensor head of one of the (above mentioned) n−1 encoders.

Further, the movement can be caused by thermal expansion of the optical element 210, by vibrations or by mechanical relaxation effects within the holding structure of the optical element 210 and/or the structure which should be kept in a fixed position, forming a reference structure for the position determination of the optical element 210. In the last mentioned cases it could be that the optical centre 213 itself keeps its position, but the sensor head 265 and/or the structured surface 263 chance their relative position due to the mentioned reasons. For very high precision position measurement and position control of the optical element 210 it is of significant importance that any expected changes in the relative position of the sensor head 265 and the structured surface 263 caused by the mentioned effects like thermal expansion, vibrations, relaxation or aging are not influencing the encoder module data. For this reason the mechanical construction has to be done such that the mentioned changes occur mainly in the measuring direction D of the sensor head 265.

Due to the advantage that the encoder module data are not sensitive to a relative movement of the optical element 210 in a direction which is parallel to the measuring direction D of the sensor head 265, it is preferred that one actuator is able to position the optical element 210 in this first direction D which coincides with the x-direction in FIG. 22. An additional actuator may position the optical element 210 in a second direction perpendicular to the mentioned direction D. Such a direction can be any direction in the yz-plane like the direction y or z if the direction D coincides with the x-direction. In this case the encoder module 260 is able to measure the movement of the optical element 210 in this second direction. In FIG. 22 this second direction is exemplary chosen as y-direction.

For the measurement of the movement of the optical element 210 along the first direction x or D in which the encoder module 260 is insensitive, an additional second encoder module 270 may be used. The additional encoder module 270 preferably is arranged such that the structured surface 273 is perpendicular to the second direction y, having the advantage that the second encoder module 270 is also insensitive to any movement of the optical element 210 in the direction of the second direction y. Just as an example the embodiment of the second encoder module 270 as shown in FIG. 22 is construed and arranged similar as in FIG. 21, meaning that the sensor head 275 is fixed on the optical module 210. Consequently the structured surface 273 is arranged on a reference structure which is kept in a fixed position and to which the position of the optical element 210 is measured. In a preferred embodiment the intersection point of the first and second direction of movement (D- or x- and y-direction) coincides with the optical centre 213. With such an arrangement the position of the optical centre 213 can be measured and can be controlled with very high precision in two degrees of freedom (D or x and y). Any thermal expansion of the optical element 210 itself can be measured and the position of the optical centre can be corrected.

If the optical element 210 should be adjustable in six degrees of freedom an arrangement like the one described in FIG. 5 can be used. The optical element (here a lens 1) is movable with three actuators 2, 3, and 4 as described. Three encoders 5, 6 and 7 are arranged in the described way. The encoders 5, 6 and 7 are constructed as encoder modules like the encoder modules 260 or 270 as described in connection with FIG. 21 and FIG. 22. Additionally the encoder modules 5, 6, and 7 are arranged as described in connection with FIG. 22, meaning that the advantage is used that the encoder module data are not sensitive to a relative movement of the optical element 210 (or the lens 1 if referred to FIG. 5) in a direction parallel to the measuring direction of the respective sensor head. To achieve this advantage the structured surfaces of the encoder modules 5, 6 and 7 are arranged perpendicular to the symmetric lines 8, 9 and 10 which are the measurement directions of the respective sensor heads of the encoders. Each of the encoder modules 5, 6, 7 can be arranged as the encoder module 260 in FIG. 22, meaning that the sensor head is arranged at a reference structure. Alternative each of the encoder modules 5, 6, 7 may be arranged as the encoder module 270 of FIG. 22, meaning that the structured surfaces of the encoder modules are arranged at a reference structure. Of course also a combination of the mentioned encoder module arrangements (like in FIG. 22) are possible, meaning that some encoder modules have their structured surfaces fixed on the reference structure, and some of the encoder modules have their sensor head fixed at the reference structure. Further, it is preferred that the measuring directions of the three sensor heads of the encoder modules 5, 6, and 7 intersect in one point or in an area which is small in comparison with the illuminated area, preferably this intersection area is smaller than $\frac{1}{100}$ of said illuminated area, or even smaller than $\frac{1}{1000}$ of said illuminated area. This intersection point or intersection area is preferably the optical centre 11 (see FIG. 5) or any "point of interest" which have to be measured and controlled very precise regarding its position or comprises this optical centre or "point of interest".

In alternative embodiments of the invention the encoder modules 260, 270 may be replaced by capacitive or inductive sensor modules, being able to determine a change in position in at least two directions.

The features of the individual embodiments which are described in this specification of the present invention can be combined or exchanged such that new embodiments of the invention will result which are not explicitly described in the specification. Such embodiments are also treated as parts of this invention. One example of combining and exchanging features of individual embodiments was given by the last described embodiment in which the embodiment of FIG. 5 was combined with the encoder technique of the embodiment of FIG. 22.

The invention claimed is:

1. An optical assembly for use in a lithography projection exposure apparatus, comprising:
   at least one optical element adjustable in at least n degrees of freedom, where n is between 2 and 6;
   at least one actuator for adjusting a position of the at least one optical element; and
   a plurality of encoder modules for sensing the position of the at least one optical element regarding the at least n degrees of freedom, wherein the plurality of encoder modules comprises at maximum n−1 encoder modules,
   wherein each encoder module of the plurality of encoder modules comprise a structured surface and a sensor head with a measuring direction, the structured surface comprises at least a structure according to a coordinate system selected from the group consisting of a Cartesian coordinate system, a polar coordinate system, and an inclined coordinate system, and
   wherein the structured surface is attached on the at least one optical element or is a part of the surface of the at least one optical element.

2. The optical assembly according to claim 1, wherein the plurality of encoder modules comprises one encoder module that determines the position of the at least one optical element in two degrees of freedom.

3. The optical assembly according to claim 1, wherein the structured surface comprises reference marks or reference scales in at least one degree of freedom.

4. The optical assembly according to claim 1, wherein the at least one actuator is arranged so that the adjustment of the at least one optical element by the at least one actuator is in a direction parallel to the measuring direction of the sensor head of one of the plurality of encoder modules.

5. The optical assembly according to claim 1, wherein the at least one optical element is adjustable in six degrees of freedom and the plurality of encoder modules comprises three encoder modules.

6. The optical assembly according to claim 5, wherein the measuring directions of the sensor heads of the three encoder modules intersect at one point of intersection or in an area of intersection that is smaller than an illuminated area of the at least one optical element.

7. The optical assembly according to claim 6, wherein the one point of intersection or the area of intersection is in close proximity to a center of the illuminated area or is in close proximity to an optical center of the at least one optical element or a thermal centre of the at least one optical element.

8. An optical assembly comprising:
   at least one optical element movable in at least two degrees of freedom;
   at least one actuator for adjusting the at least one optical element;
   at least three encoders each for measuring at least two coordinates of the optical assembly or of the at least one optical element, wherein the at least one actuator is positioned diagonally opposite or substantially diagonally opposite to one of the at least three encoders,
   wherein the at least three encoders comprise at least one encoder comprising a sensing head and a sensing gauge wherein the sensing head or the sensing gauge is fixed at the at least one optical element, and
   wherein the sensing head or the sensing gauge is fixed at the at least one optical element by gluing or wringing or optical contacting.

9. The optical assembly according to claim 8, wherein the at least three encoders are spaced substantially equally around the perimeter of the at least one optical element.

10. The optical assembly according to claim 9, wherein the at least three encoders use measurement lines that at least substantially point to an optical centre of the optical assembly or the at least one optical element.

11. The optical assembly according to claim 10, wherein the optical centre is positioned on a convex or concave reflective surface.

12. The optical assembly according to claim 8, wherein at least one encoder comprises a gauge scale comprising a two-dimensional grid for measurements of position.

13. The optical assembly according to claim 12, wherein the two-dimensional grid comprises crossing lines or a checker board system of areas.

14. The optical assembly according to claim 8, wherein the at least three encoders each comprise with an index pulse in each of the measured degrees of freedom within the working range.

15. The optical assembly according to claim 8, wherein the at least three encoders comprise measurement axes in each degree of freedom that substantially coincide at a point of coincidence.

16. The optical assembly according to claim 15, wherein the point of coincidence is substantially at or close a thermal centre of the at least one optical element.

17. An optical assembly for use in a lithography projection exposure apparatus, comprising:
   at least one optical element adjustable in at least n degrees of freedom, where n is between 2 and 6;
   at least one actuator for adjusting a position of the at least one optical element; and
   a plurality of encoder modules for sensing the position of the at least one optical element regarding the at least n degrees of freedom, wherein the plurality of encoder modules comprises at maximum n−1 encoder modules,
   wherein each encoder module of the plurality of encoder modules comprise a structured surface and a sensor head with a measuring direction, the structured surface comprises at least a structure according to a coordinate system selected from the group consisting of a Cartesian coordinate system, a polar coordinate system, and an inclined coordinate system,
   wherein the at least one optical element is adjustable in six degrees of freedom and the plurality of encoder modules comprises three encoder modules, and
   wherein the measuring directions of the sensor heads of the three encoder modules intersect at one point of intersection or in an area of intersection that is smaller than an illuminated area of the at least one optical element.

18. The optical assembly according to claim 17, wherein the plurality of encoder modules comprises one encoder module that determines the position of the at least one optical element in two degrees of freedom.

19. The optical assembly according to claim 17, wherein the structured surface comprises reference marks or reference scales in at least one degree of freedom.

20. The optical assembly according to claim 17, wherein the structured surface is attached on the at least one optical element or is a part of the surface of the at least one optical element.

21. The optical assembly according to claim 17, wherein the at least one actuator is arranged so that the adjustment of the at least one optical element by the at least one actuator is in a direction parallel to the measuring direction of the sensor head of one of the plurality of encoder modules.

22. The optical assembly according to claim 17, wherein the one point of intersection or the area of intersection is in close proximity to a center of the illuminated area or is in close proximity to an optical center of the at least one optical element or a thermal centre of the at least one optical element.

* * * * *